(12) United States Patent
Tamura

(10) Patent No.: US 7,990,027 B2
(45) Date of Patent: Aug. 2, 2011

(54) PIEZOELECTRIC DEVICE AND METHOD FOR MANUFACTURING PIEZOELECTRIC DEVICE

(75) Inventor: Seiichiro Tamura, Minowa (JP)

(73) Assignee: Epson Toyocom Corporation (JP)

( * ) Notice: Subject to any disclaimer, the term of this patent is extended or adjusted under 35 U.S.C. 154(b) by 219 days.

(21) Appl. No.: 12/406,206

(22) Filed: Mar. 18, 2009

(65) Prior Publication Data

US 2009/0236936 A1    Sep. 24, 2009

(30) Foreign Application Priority Data

Mar. 24, 2008   (JP) ................................. 2008-075089

(51) Int. Cl.
*H01L 41/053*   (2006.01)

(52) U.S. Cl. ...................................................... 310/348

(58) Field of Classification Search .................. 310/344, 310/348
See application file for complete search history.

(56) References Cited

U.S. PATENT DOCUMENTS

| | | | | |
|---|---|---|---|---|
| 4,035,673 A | * | 7/1977 | Ishida et al. | 310/344 |
| 2005/0184625 A1 | * | 8/2005 | Miyazaki | 310/348 |
| 2006/0207915 A1 | * | 9/2006 | Takebayashi | 206/701 |
| 2007/0182289 A1 | * | 8/2007 | Kigawa et al. | 310/348 |

FOREIGN PATENT DOCUMENTS

JP    2007-228295    9/2007

* cited by examiner

*Primary Examiner* — Derek J Rosenau

(74) *Attorney, Agent, or Firm* — Harness, Dickey & Pierce, P.L.C.

(57) ABSTRACT

A piezoelectric device includes: a container; a piezoelectric resonator element accommodated in the container; a circuit element accommodated in the container so as not to overlap with the piezoelectric resonator element in a plan view; and a mounting stage to which the piezoelectric resonator element is fixed. The mounting stage is fixed inside the container.

6 Claims, 4 Drawing Sheets

US 7,990,027 B2

PIEZOELECTRIC DEVICE AND METHOD FOR MANUFACTURING PIEZOELECTRIC DEVICE

BACKGROUND

1. Technical Field

The present invention relates to a low-profile piezoelectric device, and a method for manufacturing the piezoelectric device.

2. Related Art

In recent years, piezoelectric devices such as quartz crystal oscillators used in electric apparatuses such as communication devices and office automation (OA) equipment have been required to be reduced in height.

Such a piezoelectric device accommodates a piezoelectric resonator element such as a quartz resonator element and a circuit element such as an integrated circuit (IC) chip in a container such as a ceramic package. The container is air-tightly sealed by a lid. In order to reduce a height of piezoelectric devices, a configuration in which the piezoelectric resonator element and the circuit element are disposed in parallel in the container so as not to overlap with each other in a plan view has been employed (refer to JP-A-2007-228295, FIG. 4).

In the container of the piezoelectric device in such a configuration, the piezoelectric resonator element and the circuit element can be disposed when they are in the almost same size as an original design. However, the piezoelectric resonator element and the circuit element are largely different in size, causing a problem in which they cannot be disposed. In this case, a new container that can accommodate the piezoelectric resonator element and the circuit element needs to be designed. Therefore, the number of part specifications of the container is increased, making part control troublesome and complicated.

SUMMARY

The invention is proposed in order to solve the above-mentioned problems and can be achieved according to the following aspects.

A piezoelectric device according to an aspect of the invention includes: a container; a piezoelectric resonator element accommodated in the container; a circuit element accommodated in the container so as not to overlap with the piezoelectric resonator element in a plan view; and a mounting stage to which the piezoelectric resonator element is fixed. The mounting stage is fixed inside the container.

This configuration allows the mounting stage to be fixed in an arbitrary position in the container since the mounting stage and the container are not formed as a unit. Accordingly, when the piezoelectric resonator element and the circuit element are accommodated in the container, the piezoelectric resonator element and the circuit element are disposed by changing a position to fix the mounting stage as long as the piezoelectric resonator element and the circuit element can fit in the container. Therefore, a single container can accommodate a wide variety of combinations of the piezoelectric resonator element and the circuit element, improving flexibility in designing a low-profiled piezoelectric device.

In the piezoelectric device, it is preferable that the mounting stage be disposed adjacent to the circuit element, and the piezoelectric resonator element be fixed to the mounting stage so as to extend to a side opposite to a side where the circuit element is disposed.

According to the configuration, since the mounting stage is disposed adjacent to the circuit element, a wiring path between the circuit element and a connection electrode of the mounting stage is shortened, thereby reducing a parasitic capacitance caused by long wiring.

In the piezoelectric device, it is preferable that the piezoelectric resonator element include an excitation electrode and a leading electrode coupled to the excitation electrode; the mounting stage include the connection electrode coupled to the leading electrode of the piezoelectric resonator element; the piezoelectric resonator element be fixed to the mounting stage; and the circuit element include a connection terminal coupled to the connection electrode of the mounting stage by a metal wire.

According to the configuration, since the connection terminal of the circuit element and the connection electrode of the mounting stage, and a bonding terminal formed on the container and the connection electrode of the mounting stage are respectively coupled by the metal wire, the wiring path becomes shorter than a case where a wiring pattern is arranged in the container. As a result, a parasitic capacitance related to wiring is reduced.

In the piezoelectric device above, the mounting stage is preferably fixed inside the container by an adhesive.

This configuration makes easy to fix the mounting stage by using an adhesive.

In the piezoelectric device, it is preferable that the piezoelectric resonator element be fixed to the mounting stage in a cantilever fashion and the container include, inside the container, a supporting portion that is contactable with an end portion of the piezoelectric resonator element.

In this configuration, the supporting portion is formed that can restrict deflection of the end portion of the piezoelectric resonator element in a case of receiving an impact by dropping, thereby providing a piezoelectric device having an excellent impact resistance.

A method for manufacturing a piezoelectric device according to another aspect of the invention includes: fixing a mounting stage inside a container in which a piezoelectric resonator element and a circuit element are accommodated so as not to overlap with each other in a plan view; fixing the piezoelectric resonator element to a connection electrode of the mounting stage; fixing the circuit element to the container; coupling a connection terminal of the circuit element and the connection electrode of the mounting stage by a metal wire; and air-tightly sealing the container with a lid.

In the method for manufacturing a piezoelectric device above, after the mounting stage is disposed in a predetermined position, the piezoelectric resonator element and the circuit element are disposed. In this way, combinations of different types of the piezoelectric resonator element and the circuit element can be disposed in the container by changing a position to fix the mounting stage. Therefore, a method for manufacturing a low-profile piezoelectric device that can improve flexibility in design is achieved.

BRIEF DESCRIPTION OF THE DRAWINGS

The invention will be described with reference to the accompanying drawings, wherein like numbers reference like elements.

FIG. 1A is a schematic plan view of the quartz crystal oscillator, while FIG. 1B is a sectional view taken along a line A-A of FIG. 1A.

FIGS. 3A to 3D are process diagrams (Part 2) for explaining the steps for manufacturing the quartz crystal oscillator according to the first embodiment.

FIG. 4A is a schematic plan view of the quartz crystal oscillator, while FIG. 4B is a sectional view taken along a line B-B of FIG. 4A.

DESCRIPTION OF EXEMPLARY EMBODIMENTS

Hereinafter, embodiments of the invention will be described with reference to the accompanying drawings. In the embodiments below, a quartz crystal oscillator is exemplified as a piezoelectric device.

First Embodiment

Figure 1A:
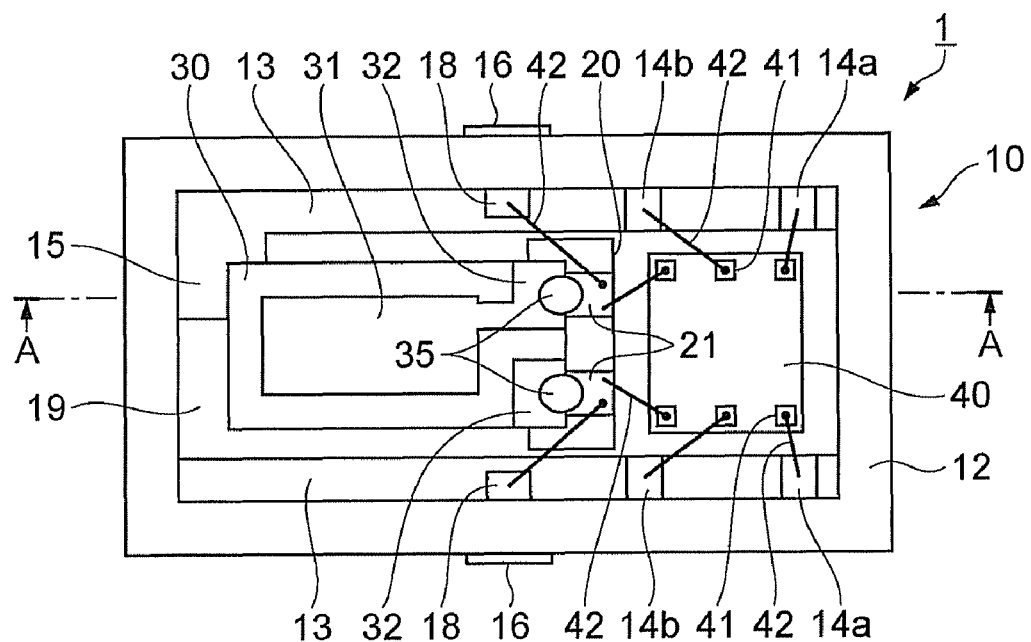
FIGS. 1A and 1B show a configuration of a quartz crystal oscillator according to a first embodiment.
Figure 1B:
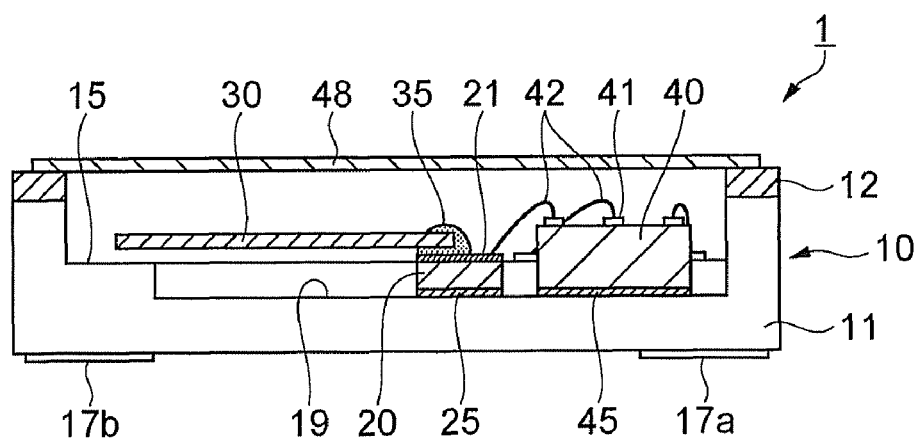

FIGS. 1A and 1B show a configuration of a quartz crystal oscillator according to a first embodiment. FIG. 1A is a schematic plan view of the quartz crystal oscillator, while FIG. 1B is a schematic sectional view taken along a line A-A of FIG. 1A.

A quartz crystal oscillator 1 includes a ceramic package 10, a mounting stage 20, a crystal resonator element 30, an IC chip 40, and a lid 48.

The ceramic package 10 includes a package body 11 and a seam ring 12. The package body 11 has a recess formed by laminating ceramic sheets, and the seam ring 12 is firmly bonded to an upper part of the package body 11.

At both sides of the recess of the package body 11 in a longitudinal direction, a step portion 13 is formed so as to have a higher level than a bottom portion 19. On the step portion 13, bonding terminals 14a, 14b, and 18 are formed. Further, a supporting portion 15 is formed so as to extend from one side of the step portion 13 in a short-side direction. At about a center of both outer sides of the package body 11 in the longitudinal direction, a side terminal 16 to be used as a test terminal is formed and coupled with the bonding terminal 18.

Further, on a bottom surface of the package body 11, external connection electrodes 17a and 17b are formed. The external connection electrode 17a is coupled with the bonding terminal 14a.

The mounting stage 20 is made of a board having an insulation property such as a ceramic board and a glass epoxy board. On a surface of the mounting stage 20, a connection electrode 21 is formed.

The mounting stage 20 is fixed to the bottom portion 19 of the package body 11 by an adhesive 25 which is an epoxy adhesive, a polyimide adhesive or the like.

The mounting stage 20 is fixed in a position where both the crystal resonator element 30 and the IC chip 40 are accommodated in the recess of the package body 11 depending on sizes of the crystal resonator element 30 and the IC chip 40.

On the crystal resonator element 30, an excitation electrode 31 and a leading electrode 32 that is led from the excitation electrode 31 are formed. The leading electrode 32 and the connection electrode 21 of the mounting stage 20 are coupled to each other and fixed by a conductive adhesive 35 such as a silver paste. That is, the leading electrode 32 and the mounting stage 20 are electrically and mechanically coupled by an adhesive member such as a conductive adhesive. The crystal resonator element 30 is thus fixed to the mounting stage 20.

Alternatively, the leading electrode 32 and the mounting stage 20 may be coupled through a metal bump. As the crystal resonator element 30, an AT-cut crystal resonator element that is a thickness-shear resonator element is used.

Further, an end portion of the crystal resonator element 30 is positioned above the supporting portion 15 of the package body 11 so that the end portion of the crystal resonator element 30 can touch the supporting portion 15 when the crystal resonator element 30 bows by receiving a force from outside due to dropping or the like.

The IC chip 40 is provided with a plurality of bonding pads 41. Further, the IC chip 40 includes an oscillation circuit, a voltage control circuit, a temperature compensation circuit and the like inside thereof. The IC chip 40 is fixed to the bottom portion 19 of the package body 11 by an adhesive 45 which is an epoxy adhesive, a polyimide adhesive or the like.

The bonding pads 41 are respectively coupled to the bonding terminals 14a and 14b of the package body 11, and the connection electrode 21 of the mounting stage 20 by a metal wire 42 such as a gold wire.

The bonding terminal 18 of the package body 11 is coupled to the connection electrode 21 of the mounting stage 20 by the metal wire 42 such as a gold wire.

Accordingly, the mounting stage 20 is disposed adjacent to the IC chip 40, and the crystal resonator element 30 is extended in a direction opposite to the IC chip 40. That is, the IC chip 40, the mounting stage 20, and the crystal resonator element 30 are arranged inside the ceramic package 10 so that the mounting stage 20 is disposed adjacent to the IC chip 40, and a direction from a fixed end of the crystal resonator element 30 to a free end of the crystal resonator element 30 is opposite to a direction from the mounting stage 20 to the IC chip 40.

Therefore, a wiring path between the bonding pads 41 of the IC chip 40 and the leading electrode 32 of the crystal resonator element 30 is shortened.

Then, the seam ring 12 formed on the upper part of the package body 11 and the lid 48 are seam-welded so as to air-tightly seal the package 10. The seam ring 12 and the lid 48 are made of metal such as kovar.

Next, a method for manufacturing the quartz crystal oscillator having the configuration above will be explained.

FIGS. 2A through 3C are process diagrams for explaining steps for manufacturing the quartz crystal oscillator.

Figure 2A:
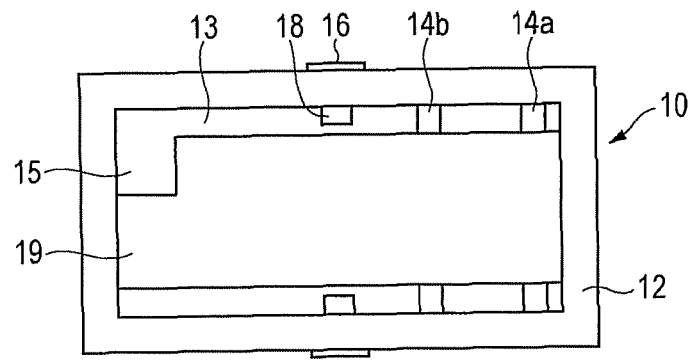
FIGS. 2A to 2C are process diagrams (Part 1) for explaining steps for manufacturing the quartz crystal oscillator according to the first embodiment.

First, the ceramic package 10 is prepared as shown in FIG. 2A.

Figure 2B:
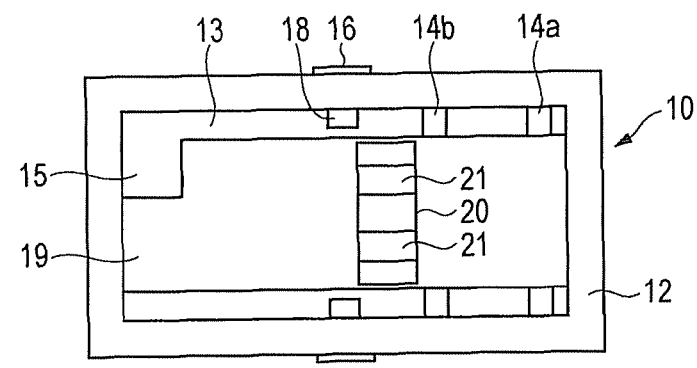

Next, the mounting stage 20 is fixed to the bottom portion 19 of the ceramic package 10 with the adhesive 25 as shown in FIG. 2B.

Figure 2C:
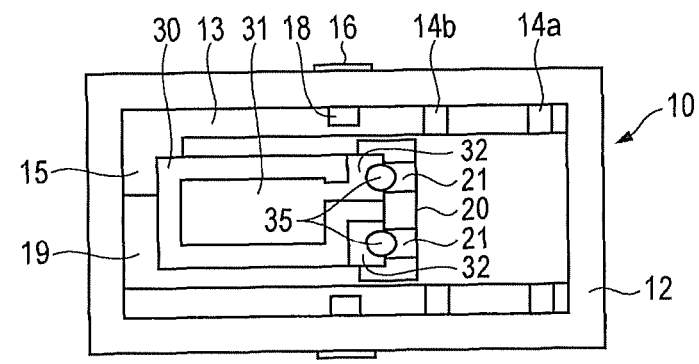

Subsequently, as shown in FIG. 2C, the crystal resonator element 30 is fixed to the mounting stage 20 with the conductive adhesive 35. Here, the crystal resonator element 30 is positioned so that the leading electrode 32 of the crystal resonator element 30 and the connection electrode 21 of the mounting stage 20 are electrically coupled. Accordingly, the crystal resonator element 30 has a cantilever-supported configuration in which one end of the crystal resonator element 30 is fixed to the mounting stage 20 and the other end thereof is free.

Figure 2D:
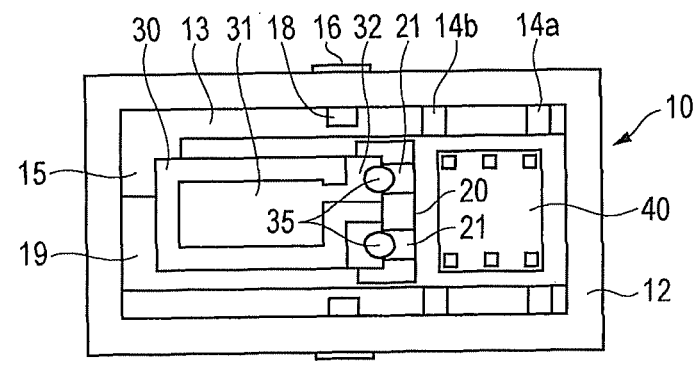

Thereafter, the IC chip 40 is fixed to the bottom portion 19 of the ceramic package 10 with the adhesive 45 as shown in FIG. 2D.

Figure 3A:
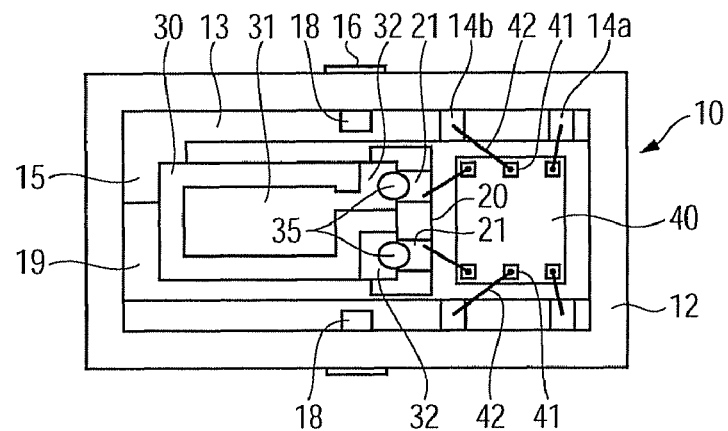

Then, as shown in FIG. 3A, the bonding pads 41 of the IC chip 40 are respectively coupled with the bonding terminals 14a and 14b of the ceramic package 10 and the connection electrode 21 of the mounting stage 20 by the metal wire 42.

Figure 3B:
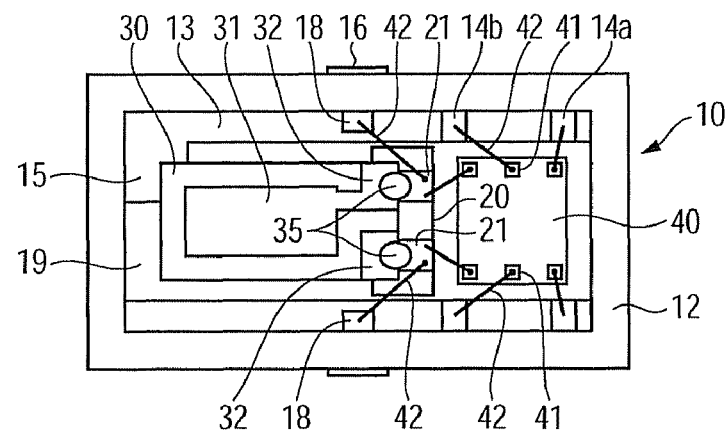

Subsequently, as shown in FIG. 3B, the bonding terminal 18 of the ceramic package 10 is coupled with the connection electrode 21 of the mounting stage 20 by the metal wire 42.

Figure 3C:
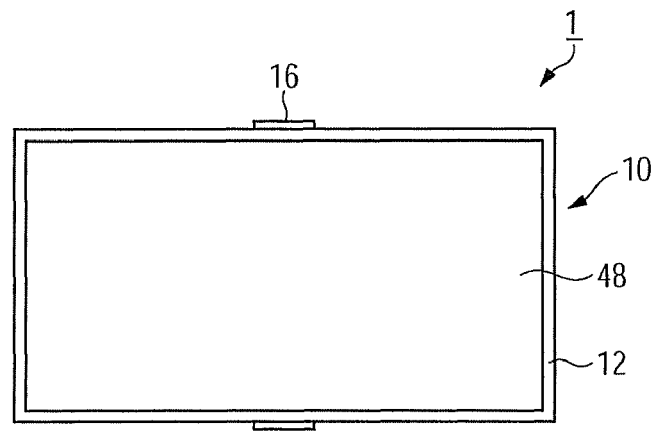

Further, as shown in FIG. 3C, the lid 48 is disposed on the top of the ceramic package 10. Then the seam ring 12 and the lid 48 are seam-welded in a nitrogen atmosphere so as to air-tightly seal the ceramic package 10.

As described above, in the quartz crystal oscillator 1 according to the first embodiment, the mounting stage 20 is allowed to be fixed in an arbitrary position in the ceramic package 10 since the mounting stage 20 and the ceramic package 10 are not formed as a unit. Therefore, when the crystal resonator element 30 and the IC chip 40 are accommodated in the ceramic package 10, the crystal resonator element 30 and the IC chip 40 can be disposed by changing a position to fix the mounting stage 20 as long as the crystal resonator element 30 and the IC chip 40 can fit in the ceramic package 10. As a result, a wide variety of positions of the crystal resonator element 30 and the IC chip 40 are possible for a single ceramic package 10, improving flexibility in designing the quartz crystal oscillator 1.

Further, since the mounting stage 20 is disposed adjacent to the IC chip 40, the wiring path between the IC chip 40 and the leading electrode 32 of the mounting stage 20 is shortened, thereby reducing a parasitic capacitance caused by long wiring.

Furthermore, since the bonding pads 41 of the IC chip 40 and the leading electrode 21 of the mounting stage 20, and the bonding terminal 18 of the ceramic package 10 and the connection electrode 21 of the mounting stage 20 are respectively coupled by the metal wire 42, wiring paths become shorter than a case where a wiring pattern is arranged in the ceramic package 10. As a result, a parasitic capacitance related to wiring is reduced.

In addition, the supporting portion 15 is formed that can restrict deflection of the end portion of the crystal resonator element 30 in a case where the ceramic package 10 receives an impact, thereby providing the quartz crystal oscillator 1 having an excellent impact resistance.

Second Embodiment

A quartz crystal oscillator according to a second embodiment will now be described. The second embodiment is a case where the IC chip to be accommodated in the ceramic package is larger, and the crystal resonator element is smaller compared to the first embodiment.

Figure 4A:
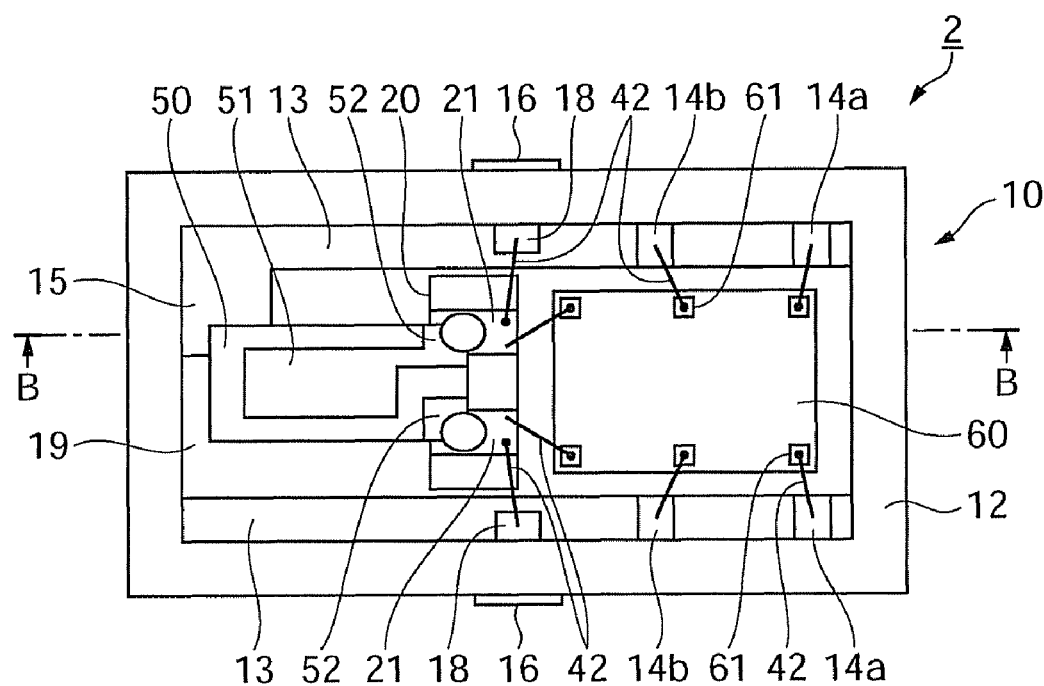
FIGS. 4A and 4B show a configuration of a quartz crystal oscillator according to a second embodiment.
Figure 4B:
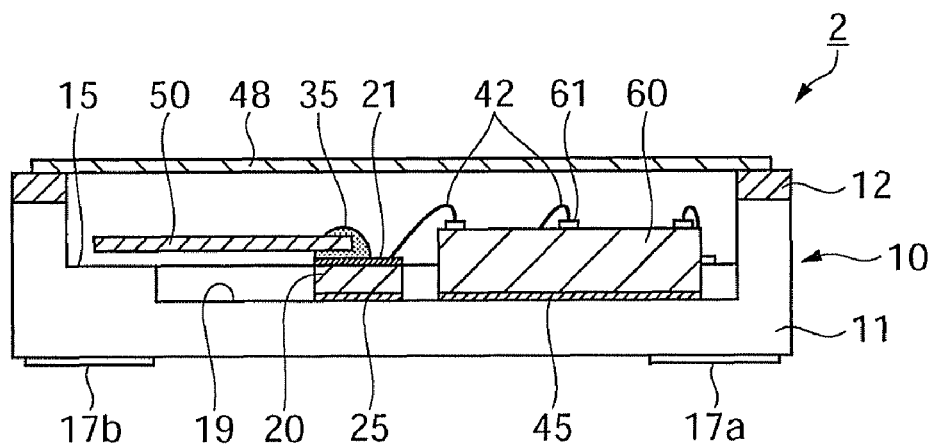

FIGS. 4A and 4B show a configuration of a quartz crystal oscillator according to the second embodiment. FIG. 4A is a schematic plan view of the quartz crystal oscillator, while FIG. 4B is a schematic sectional view taken along a line B-B of FIG. 4A. In the second embodiment, the same ceramic package and the same mounting stage as those of the first embodiment are used. Components in the same configuration as those in the first embodiment will be given the same reference numerals as those therein, and further description thereof will be omitted.

A quartz crystal oscillator 2 includes the ceramic package 10, the mounting stage 20, a crystal resonator element 50, an IC chip 60, and the lid 48.

The mounting stage 20 is fixed to the bottom portion 19 of the package body 11 by the adhesive 25 which is an epoxy adhesive, a polyimide adhesive or the like.

The mounting stage 20 is fixed in a position where both the crystal resonator element 50 and the IC chip 60 are accommodated in the recess of the package body 11 in accordance with sizes of the crystal resonator element 50 and the IC chip 60.

On the crystal resonator element 50, an excitation electrode 51 and a leading electrode 52 that is led from the excitation electrode 51 are formed. The leading electrode 52 and the connection electrode 21 of the mounting stage 20 are coupled to each other and fixed by the conductive adhesive 35 such as a silver paste. That is, the leading electrode 52 and the mounting stage 20 are electrically and mechanically coupled by an adhesive member such as a conductive adhesive. The crystal resonator element 50 is thus fixed to the mounting stage 20.

Alternatively, the leading electrode 52 and the mounting stage 20 may be coupled through a metal bump. As the crystal resonator element 50, an AT-cut crystal resonator element that is a thickness-shear resonator element is used.

The IC chip 60 is provided with a plurality of bonding pads 61. Further the IC chip 60 includes an integrated oscillation circuit, a voltage control circuit, a temperature compensation circuit and the like inside thereof. The IC chip 60 is fixed to the bottom portion 19 of the package body 11 by the adhesive 45 which is an epoxy adhesive, a polyimide adhesive or the like.

The bonding pads 61 are respectively coupled to the bonding terminals 14a and 14b of the package body 11, and the connection electrode 21 of the mounting stage 20 by the metal wire 42 such as a gold wire.

The bonding terminal 18 of the package body 11 is coupled with the connection electrode 21 of the mounting stage 20 by the metal wire 42 such as a gold wire.

Accordingly, the mounting stage 20 is disposed adjacent to the IC chip 60, and a wiring path between the bonding pads 61 of the IC chip 60 and the leading electrode 52 of the crystal resonator element 50 is shortened.

As the above, in the second embodiment, the crystal resonator element 50 and the IC chip 60 that are different in size are allowed to be accommodated in the ceramic package 10 that is the same as the first embodiment. Thus, the same advantageous effect as the first embodiment can be obtained.

In the embodiments above, a rectangular flat plate is used as the mounting stage. However, a plate with a step may be used instead. Further, a shape of the mounting stage can also be appropriately changed as long as the shape fits in a container.

In the embodiments above, the quartz crystal oscillators using the crystal resonator element are exemplified. However, the invention is applicable to a surface acoustic wave (SAW) oscillator using a SAW resonator element, or a gyro sensor using a gyro element.

The entire disclosure of Japanese Patent Application No. 2008-075089, filed Mar. 24, 2008 is expressly incorporated by reference herein.

What is claimed is:

1. A piezoelectric device, comprising:
   a container, the container including a step portion that surrounds a bottom portion to define a recessed area within the container;
   a piezoelectric resonator element accommodated in the container, a free end of the piezoelectric resonator overlapping the step portion;
   a circuit element accommodated in the container so as not to overlap with the piezoelectric resonator element in a plan view; and
   a mounting stage to which the piezoelectric resonator element is fixed, the mounting stage being fixed on the bottom portion inside the container.

2. The piezoelectric device according to claim 1, wherein the mounting stage is disposed adjacent to the circuit element, and the piezoelectric resonator element is fixed to the mounting stage so as to extend to a side opposite to a side where the circuit element is disposed.

3. The piezoelectric device according to claim 2, wherein: the piezoelectric resonator element includes an excitation electrode and a leading electrode coupled to the excitation electrode; the mounting stage includes a connection electrode coupled to the leading electrode of the piezoelectric resonator element; and the circuit element includes a connection terminal coupled to the connection electrode of the mounting stage by a metal wire.

4. The piezoelectric device according to claim 1, wherein the mounting stage is fixed inside the container by an adhesive.

5. The piezoelectric device according to claim 1, wherein the piezoelectric resonator element is fixed to the mounting stage in a cantilever fashion and the container includes, inside the container, a supporting portion that is contactable with an end portion of the piezoelectric resonator element.

6. A method for manufacturing a piezoelectric device, comprising:
fixing a mounting stage to a bottom portion of a container in which a piezoelectric resonator element and a circuit element are accommodated so as not to overlap with each other in a plan view, the container including a step portion that surrounds the bottom portion to define a recessed area within the container;
fixing the piezoelectric resonator element to a connection electrode of the mounting stage, a free end of the piezoelectric resonator element overlapping the step portion;
fixing the circuit element to the bottom surface of the container;
coupling a connection terminal of the circuit element and the connection electrode of the mounting stage by a metal wire; and
air-tightly sealing the container with a lid.

* * * * *